(12) United States Patent
Terashima et al.

(10) Patent No.: US 11,616,479 B2
(45) Date of Patent: Mar. 28, 2023

(54) POWER AMPLIFIER APPARATUS

(71) Applicant: Murata Manufacturing Co., Ltd., Kyoto (JP)

(72) Inventors: Toshikazu Terashima, Kyoto (JP); Fumio Harima, Kyoto (JP); Makoto Itou, Kyoto (JP); Satoshi Tanaka, Kyoto (JP); Kazuo Watanabe, Kyoto (JP); Satoshi Arayashiki, Kyoto (JP); Chikara Yoshida, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 413 days.

(21) Appl. No.: 16/839,226

(22) Filed: Apr. 3, 2020

(65) Prior Publication Data

US 2020/0321927 A1    Oct. 8, 2020

(30) Foreign Application Priority Data

Apr. 5, 2019  (JP) .............................. JP2019-073115

(51) Int. Cl.
*H03F 3/213*    (2006.01)
*H01L 29/417*   (2006.01)
(Continued)

(52) U.S. Cl.
CPC ............. *H03F 3/213* (2013.01); *H01L 23/48* (2013.01); *H01L 27/0647* (2013.01);
(Continued)

(58) Field of Classification Search
CPC . H03F 3/213; H03F 3/195; H03F 3/20; H03F 3/211; H03F 3/245; H03F 3/602;
(Continued)

(56) References Cited

U.S. PATENT DOCUMENTS

| | | |
|---|---|---|
| 9,647,656 B2 | 5/2017 | Masuda |
| 10,511,267 B2 | 12/2019 | Torii et al. |
| 2018/0152143 A1 | 5/2018 | Tanaka et al. |

FOREIGN PATENT DOCUMENTS

| | | |
|---|---|---|
| CN | 106330109 A | 1/2017 |
| JP | 2014-165259 A | 9/2014 |

(Continued)

OTHER PUBLICATIONS

Office Action for Korean Patent Application No. 10-2020-0037214 dated Dec. 31, 2021.

*Primary Examiner* — Hafizur Rahman
*Assistant Examiner* — Khiem D Nguyen
(74) *Attorney, Agent, or Firm* — Pearne & Gordon LLP

(57) ABSTRACT

A power amplifier apparatus includes a semiconductor substrate, a plurality of first transistors on the semiconductor substrate, a plurality of second transistors, at least one collector terminal electrically connected to collectors of the plurality of first transistors, a first inductor having a first end electrically connected to the collector terminal and a second end electrically connected to a power supply potential, at least one emitter terminal electrically connected to emitters of the plurality of second transistors and adjacent to the collector terminal in a second direction, a second inductor having a first end electrically connected to the emitter terminal and a second end electrically connected to a reference potential, and at least one capacitor having a first end electrically connected to the collectors of the plurality of first transistors and a second end electrically connected to the emitters of the plurality of second transistors.

19 Claims, 12 Drawing Sheets

(51) Int. Cl.
*H01L 27/06* (2006.01)
*H01L 29/737* (2006.01)
*H01L 29/423* (2006.01)
*H01L 23/48* (2006.01)

(52) U.S. Cl.
CPC .... *H01L 27/0658* (2013.01); *H01L 29/41708* (2013.01); *H01L 29/42304* (2013.01); *H01L 29/737* (2013.01); *H03F 2200/222* (2013.01); *H03F 2200/267* (2013.01)

(58) Field of Classification Search
CPC ...... H03F 1/22; H03F 1/565; H03F 2200/222; H03F 2200/267; H03F 2200/168; H03F 2200/366; H03F 2200/451
USPC .......................................... 330/307, 296, 311
See application file for complete search history.

(56) References Cited

FOREIGN PATENT DOCUMENTS

| | | |
|---|---|---|
| JP | 2018-85689 A | 5/2018 |
| WO | 2017/098578 A1 | 6/2017 |

POWER AMPLIFIER APPARATUS

This application claims priority from Japanese Patent Application No. 2019-073115 filed on Apr. 5, 2019. The content of this application is incorporated herein by reference in its entirety.

BACKGROUND

The present disclosure relates to a power amplifier apparatus. International Publication No. 2017/098578 describes a multi-finger transistor having a plurality of transistors that are connected in parallel with each other. Japanese Unexamined Patent Application Publication No. 2018-85689 describes a power amplifier circuit. In Japanese Unexamined Patent Application Publication No. 2018-85689, a first transistor and a second transistor are cascode-connected via a capacitor.

When a plurality of multi-finger transistors are cascode-connected via a capacitor, various terminals and the capacitor, which are connected to the plurality of transistors, are disposed on the same substrate. Thus, variations occur in potential difference or phase difference between signals supplied to, among the plurality of transistors included in the multi-finger transistors, a transistor at a position close to a terminal and a transistor at a position far away from the terminal, which can cause non-uniform operations of the plurality of transistors. Neither International Publication No. 2017/098578 nor Japanese Unexamined Patent Application Publication No. 2018-85689 describes a configuration in which a plurality of multi-finger transistors are cascode-connected via a capacitor.

BRIEF SUMMARY

Accordingly, the present disclosure provides a power amplifier apparatus with reduced variations in the operation of a plurality of transistors.

According to embodiments of the present disclosure, a power amplifier apparatus includes a semiconductor substrate; a plurality of first transistors on the semiconductor substrate, the plurality of first transistors being arranged in a first direction; a plurality of second transistors spaced apart from the plurality of first transistors in a second direction perpendicular to or intersecting the first direction, the plurality of second transistors being arranged in the first direction; at least one collector terminal electrically connected to collectors of the plurality of first transistors; a first inductor having a first end electrically connected to the at least one collector terminal and a second end electrically connected to a power supply potential; at least one emitter terminal electrically connected to emitters of the plurality of second transistors, the at least one emitter terminal being disposed adjacent to the at least one collector terminal in the second direction; a second inductor having a first end electrically connected to the at least one emitter terminal and a second end electrically connected to a reference potential; and at least one capacitor having a first end electrically connected to the collectors of the plurality of first transistors and a second end electrically connected to the emitters of the plurality of second transistors.

In the configuration described above, since a collector terminal and an emitter terminal are disposed adjacent to each other, the first inductor and the second inductor are coupled to each other and perform a function. Thus, even if variations in inductance values occur between the first inductor and the second inductor, the first inductor and the second inductor can accomplish the choke function such that the respective inductance values can complement each other.

According to embodiments of the present disclosure, a power amplifier apparatus can reduce variations in the operation of a plurality of transistors.

Other features, elements, characteristics and advantages of the present disclosure will become more apparent from the following detailed description of embodiments of the present disclosure with reference to the attached drawings.

DETAILED DESCRIPTION

The following describes power amplifier apparatuses according to embodiments of the present disclosure with reference to the drawings. The embodiments are not intended to limit the present disclosure. It is to be understood that the embodiments are illustrative and that configurations provided in different embodiments may be partially replaced or combined. In the second and subsequent embodiments, description of matters common to the first embodiment is omitted, and only the differences will be described. In particular, similar operational effects achieved with similar configurations will not be described again in the individual embodiments.

First Embodiment

Figure 1:
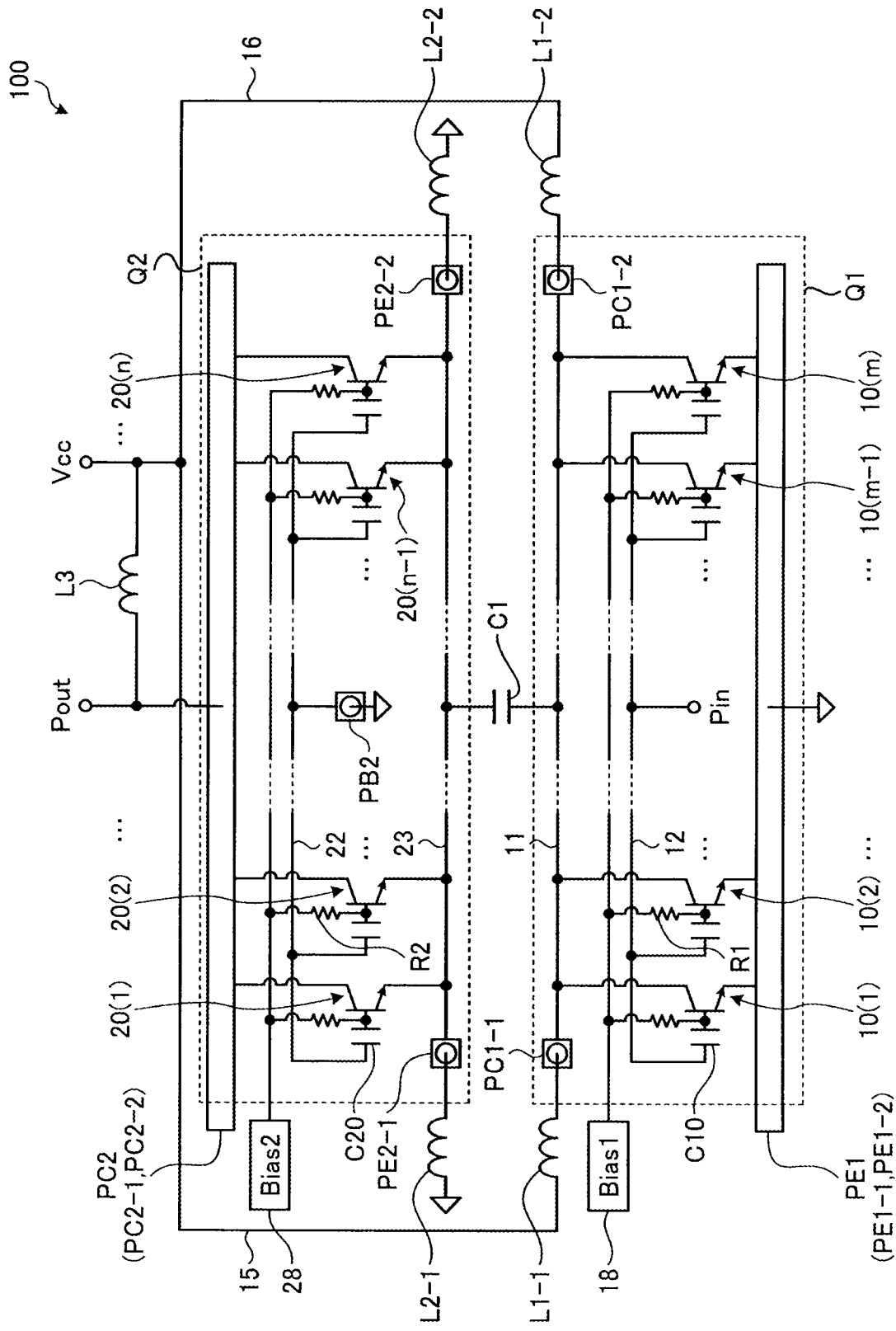
FIG. 1 is a circuit diagram illustrating a power amplifier apparatus according to a first embodiment.

FIG. 1 is a circuit diagram illustrating a power amplifier apparatus 100 according to a first embodiment. As illustrated in FIG. 1, the power amplifier apparatus 100 includes a first transistor group Q1, a second transistor group Q2, a capacitor C1, a first power feed line 15, a second power feed line 16, first inductors L1-1 and L1-2, second inductors L2-1 and L2-2, and a third inductor L3.

The first transistor group Q1 includes a plurality of first transistors $10(1)$, $10(2)$, . . . , $10(m-1)$, and $10(m)$. The second transistor group Q2 includes a plurality of second transistors $20(1)$, $20(2)$, . . . , $20(n-1)$, and $20(n)$. In the following description, the plurality of first transistors $10(1)$, 10(2), . . . , 10(m−1), and 10(m) are simply referred to as "first transistors 10" unless otherwise distinguished. The plurality of second transistors 20(1), 20(2), . . . , 20(n−1), and 20(n) are simply referred to as "second transistors 20" unless otherwise distinguished.

The plurality of first transistors 10 and the plurality of second transistors 20 are each a heterojunction bipolar transistor (HBT). The plurality of first transistors 10 are electrically connected in parallel with each other to form the first transistor group Q1. The plurality of second transistors 20 are electrically connected in parallel with each other to form the second transistor group Q2.

The number m of first transistors 10 and the number n of second transistors 20 can be changed, as desired, in accordance with the performance (e.g., maximum output voltage) required for the power amplifier apparatus 100. The number m of first transistors 10 and the number n of second transistors 20 may be the same or different.

The power amplifier apparatus 100 amplifies an input signal Pin input to the plurality of first transistors 10 and outputs an output signal Pout from the plurality of second transistors 20. Specifically, the collectors of the plurality of first transistors 10 are connected to a common first collector line 11. A first collector terminal PC1-1 is connected to a first end of the first collector line 11. A first end of the first inductor L1-1 is connected to the first collector terminal PC1-1, and a second end of the first inductor L1-1 is electrically connected to a power supply potential Vcc via the first power feed line 15.

A first collector terminal PC1-2 is connected to a second end of the first collector line 11. A first end of the first inductor L1-2 is connected to the first collector terminal PC1-2, and a second end of the first inductor L1-2 is electrically connected to the power supply potential Vcc via the second power feed line 16. A common power supply potential Vcc is supplied to the two first collector terminals PC1-1 and PC1-2. Accordingly, the power supply potential Vcc is supplied to the collectors of the plurality of first transistors 10 via the first inductors L1-1 and L1-2 and the first collector terminals PC1-1 and PC1-2. The first inductors L1-1 and L1-2 are each a choke inductor that prevents coupling of a high-frequency signal to a power supply circuit by passing direct current and blocking alternating current.

The bases of the plurality of first transistors 10 are connected to a common first base line 12 via respective capacitors C10. The capacitors C10 are each a capacitance element for cutting a direct-current component. The input signal Pin is supplied to the bases of the plurality of first transistors 10 via the first base line 12. The bases of the plurality of first transistors 10 are electrically connected to first ends of resistors R1. Second ends of the resistors R1 are electrically connected to a first bias circuit 18. The bases of the plurality of first transistors 10 is supplied with a bias current or bias voltage from the first bias circuit 18 and also receives input of, for example, an amplified signal from an amplifier in the drive stage as the input signal Pin.

The emitters of the plurality of first transistors 10 are connected to a common first emitter terminal PE1. The first emitter terminal PE1 is electrically connected to a reference potential, thereby allowing the emitters of the plurality of first transistors 10 to be electrically connected to the reference potential. Exemplarily, the reference potential is a ground potential, although the present disclosure is not limited thereto. The collector-emitter currents of the plurality of first transistors 10 flow through a path formed by the two first collector terminals PC1-1 and PC1-2, the first collector line 11, the parallel-connected plurality of first transistors 10, and the first emitter terminal PE1.

The plurality of second transistors 20 are cascode-connected to the plurality of first transistors 10 via the capacitor C1. Specifically, the collectors of the plurality of second transistors 20 are connected to a common second collector terminal PC2. The power supply potential Vcc is supplied to the second collector terminal PC2 via the third inductor L3. Accordingly, the power supply potential Vcc is supplied to the collectors of the plurality of second transistors 20. The power supply potential Vcc supplied to the plurality of second transistors 20 and the power supply potential Vcc supplied to the plurality of first transistors 10 are common. However, this is not restrictive. The power supply potential supplied to the plurality of second transistors 20 and the power supply potential supplied to the plurality of first transistors 10 may be different.

The bases of the plurality of second transistors 20 are connected to a common second base line 22 via respective capacitors C20. The capacitors C20 are each a capacitance element for cutting a direct-current component. The second base line 22 is connected to a base terminal PB2. The bases of the plurality of second transistors 20 are grounded via the second base line 22 and the base terminal PB2. The bases of the plurality of second transistors 20 are electrically connected to first ends of resistors R2. Second ends of the resistors R2 are electrically connected to a second bias circuit 28. The bases of the plurality of second transistors 20 are supplied with a bias current or bias voltage from the second bias circuit 28.

The emitters of the plurality of second transistors 20 are connected to a common second emitter line 23. A second emitter terminal PE2-1 is connected to a first end of the second emitter line 23. The second emitter terminal PE2-1 is grounded via the second inductor L2-1. A second emitter terminal PE2-2 is connected to a second end of the second emitter line 23. The second emitter terminal PE2-2 is grounded via the second inductor L2-2. Accordingly, the emitters of the plurality of second transistors 20 are grounded via the second emitter terminals PE2-1 and PE2-2 and the second inductors L2-1 and L2-2.

The collector-emitter currents of the plurality of second transistors 20 flow through a path formed by the second collector terminal PC2, the parallel-connected plurality of second transistors 20, the second emitter line 23, and the two second emitter terminals PE2-1 and PE2-2. The second inductors L2-1 and L2-2 are each a choke inductor that passes direct current and blocks alternating current.

A first end of the capacitor C1 is electrically connected to the collectors of the plurality of first transistors 10 via the first collector line 11. A second end of the capacitor C1 is electrically connected to the emitters of the plurality of second transistors 20 via the second emitter line 23. Accordingly, the plurality of second transistors 20 are cascode-connected to the plurality of first transistors 10 via the capacitor C1.

The operation of the power amplifier apparatus 100 will be described in detail. In the following description, the power supply potential Vcc is set to 3 volts (hereinafter sometimes referred to as "DC3V"), although the present disclosure is not limited thereto. For example, an envelope power supply or a step-up/down power supply using a DC-DC converter may be connected.

The first end of the capacitor C1 is electrically connected to the collectors of the plurality of first transistors 10, and the second end of the capacitor C1 is electrically connected to the emitters of the plurality of second transistors 20. The capacitor C1 isolates the plurality of first transistors 10 and the plurality of second transistors 20 from each other for direct current and couples the plurality of first transistors 10 and the plurality of second transistors 20 to each other for alternating current.

First ends of the second inductors L2-1 and L2-2 are electrically connected to the emitters of the plurality of second transistors 20, and second ends of the second inductors L2-1 and L2-2 are grounded. The second inductors L2-1 and L2-2 have high impedance to high frequencies and thus do not affect the amplification of high-frequency signals. That is, the second inductors L2-1 and L2-2 ground the emitters of the plurality of second transistors 20 for direct current.

Description will be given focusing on the plurality of first transistors 10. The emitters of the plurality of first transistors 10 are grounded, and the power supply potential Vcc (here, DC3V) is supplied to the collectors of the plurality of first transistors 10 via the first inductors L1-1 and L1-2. Accordingly, the high-frequency signal at the collectors of the plurality of first transistors 10 has an amplitude of ±3 V for alternating current (hereinafter sometimes referred to as AC±3V). That is, the collector potentials of the plurality of first transistors 10 vary over a range of 3 V±3 V, or a range from 0 V to +6 V.

Description will be given focusing on the plurality of second transistors 20. The emitters of the plurality of second transistors 20 are grounded for direct current, resulting in DC0V, and is coupled (connected) to the collectors of the plurality of first transistors 10 for alternating current, resulting in AC±3V. Accordingly, the emitter voltages of the plurality of second transistors 20 vary over a range of 0 V±3 V, or a range from −3 V to +3 V.

The collectors of the plurality of second transistors 20 are supplied with the power supply potential Vcc for direct current, and thus the collector potentials of the plurality of second transistors 20 are DC3V. For alternating current, the collector potentials of the plurality of second transistors 20 are in a range of AC±6V including the range over which the emitter voltages of the plurality of second transistors 20 vary. Accordingly, the output signal Pout has an amplitude of AC±6V. That is, the collector potentials of the plurality of second transistors 20 vary over a range of 3 V±6 V, or a range from −3 V to +9 V.

That is, the collectors of the plurality of second transistors 20 have a signal amplitude of 12 V (from −3 V to +9 V), which is substantially twice as large as the signal amplitude of the collectors of the plurality of first transistors 10, that is, 6 V (from 0 V to +6 V).

As described above, the power amplifier apparatus 100 has a cascode configuration in which the plurality of first transistors 10 and the plurality of second transistors 20 are connected to each other via the capacitor C1. With this configuration, the power amplifier apparatus 100 can increase the amplitude of the output signal Pout (e.g., 12 V, from −3 V to +9 V) to a value that is about twice as large as the amplitude of an output signal of a power amplifier with a single configuration (e.g., 6 V, from 0 V to +6 V). That is, the power amplifier apparatus 100 can increase the amplitude of the output signal Pout without necessarily increasing the power supply potential using a step-up circuit.

Given that the output power of a signal is denoted by P, the collector voltage is denoted by V, and the load impedance is denoted by R, a relation of $P=V^2/R$ is satisfied. Assuming that the load impedance R is kept constant, when the collector voltage V is doubled, the output power P is substantially quadrupled. Accordingly, the power amplifier apparatus 100 can increase the output power, compared with that of a power amplifier with a single configuration, by increasing the amplitude of the output signal Pout without necessarily increasing the power supply potential.

Assuming that the output power P is kept constant, when the collector voltage V is doubled, the load impedance R is substantially quadrupled. In general, as the load impedance increases, the impedance transformation ratio of a matching circuit decreases. The impedance transformation ratio is a transformation ratio for performing impedance matching for a load circuit. Accordingly, the insertion loss and the return loss of the matching circuit are reduced, and the power-added efficiency (PAE) improves. Also in this embodiment, the load impedance increases with an increase in the amplitude of the output signal Pout, resulting in a decrease in the impedance transformation ratio of the matching circuit. Thus, the power amplifier apparatus 100 provides improved power-added efficiency with reduced loss of the output signal Pout in the matching circuit, compared with a power amplifier with a single configuration. As described above, the power amplifier apparatus 100 can also improve power-added efficiency.

Figure 2:
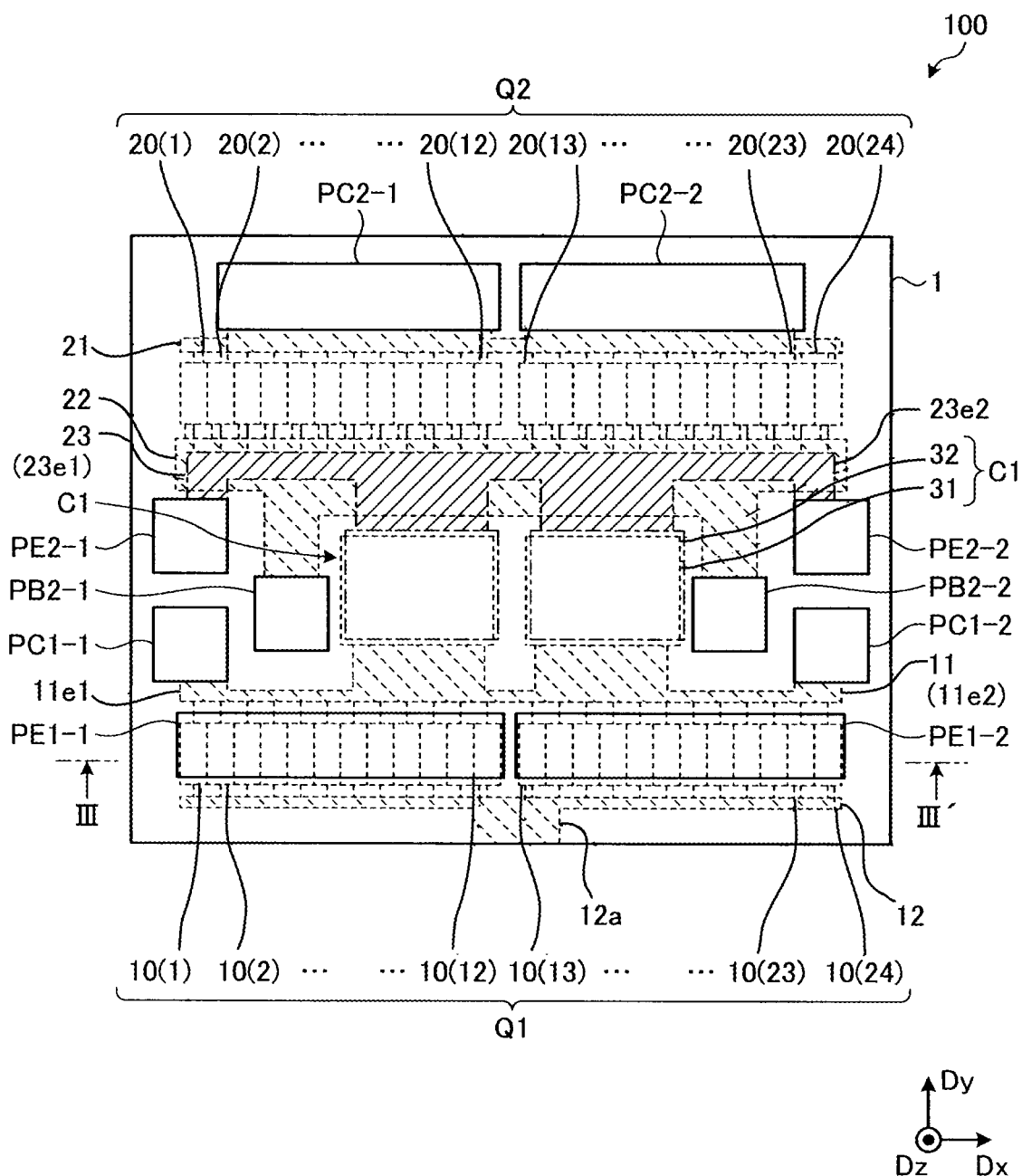
FIG. 2 is a plan view of the power amplifier apparatus according to the first embodiment.

Next, the plan-view configuration of the power amplifier apparatus 100 will be described. FIG. 2 is a plan view of the power amplifier apparatus 100 according to the first embodiment. As illustrated in FIG. 2, the power amplifier apparatus 100 further includes a semiconductor substrate 1. The plurality of first transistors 10 and the plurality of second transistors 20 are disposed on the semiconductor substrate 1.

In the following description, a direction in a plane parallel to a surface of the semiconductor substrate 1 is represented by a first direction Dx. A direction perpendicular to the first direction Dx in the plane parallel to the surface of the semiconductor substrate 1 is represented by a second direction Dy. A direction perpendicular to the first direction Dx and the second direction Dy is represented by a third direction Dz. The third direction Dz is a direction vertical to the semiconductor substrate 1. This is not restrictive, and the second direction Dy may intersect the first direction Dx at an angle other than 90°. The third direction Dz may intersect the first direction Dx and the second direction Dy at an angle other than 90°. The term "plan view", as used herein, refers to a view as seen in the third direction Dz.

The plurality of first transistors 10 are arranged in the first direction Dx. The plurality of second transistors 20 are spaced apart from the plurality of first transistors 10 in the second direction Dy and are arranged in the first direction Dx. The first collector terminals PC1-1 and PC1-2, the second emitter terminals PE2-1 and PE2-2, base terminals PB2-1 and PB2-2, and capacitors C1 are located between the plurality of first transistors 10 and the plurality of second transistors 20, the plurality of first transistors 10 and the plurality of second transistors 20 being adjacent in the second direction Dy.

Two first collector terminals PC1-1 and PC1-2, two second emitter terminals PE2-1 and PE2-2, two base terminals PB2-1 and PB2-2, and two capacitors C1 are disposed. However, a single capacitor C1 may be disposed, and any one of the base terminals PB2-1 and PB2-2 may be disposed.

The first collector terminal PC1-1 located in the vicinity of the first transistor 10(1) positioned at a first end of the plurality of first transistors 10 in the first direction Dx. The first collector terminal PC1-1 is connected to a first end 11e1 of the first collector line 11 and is electrically connected to the collectors of the plurality of first transistors 10. As used here, the term "vicinity" refers to the first collector terminal PC1-1 and a first transistor 10 being placed at different positions with any other passive element or active element interposed therebetween. More specifically, the term "vicinity" is used to include an area adjacent to the first transistor 10(1) in the second direction Dy.

The first collector terminal PC1-2 is located in the vicinity of the first transistor 10(24) positioned at a second end of the plurality of first transistors 10 in the first direction Dx. The first collector terminal PC1-2 is connected to a second end 11e2 of the first collector line 11 and is electrically connected to the collectors of the plurality of first transistors 10.

In this embodiment, the two first collector terminals PC1-1 and PC1-2 are disposed at both ends of the plurality of first transistors 10 arranged in the first direction Dx. Accordingly, compared with a configuration including any one of the first collector terminals PC1-1 and PC1-2, the difference between the distances between each of the first collector terminals PC1-1 and PC1-2 and the plurality of first transistors 10 can be reduced. For example, the difference between the distance to the first collector terminal PC1-1 from the first transistor 10(1), which is the closest to the first collector terminal PC1-1, and the distance to the first collector terminal PC1-1 from the first transistor 10(12), which is the farthest away from the first collector terminal PC1-1, can be reduced, and the difference between the distance to the first collector terminal PC1-2 from the first transistor 10(24), which is the closest to the first collector terminal PC1-2, and the distance to the first collector terminal PC1-2 from the first transistor 10(13), which is the farthest away from the first collector terminal PC1-2, can be reduced. As used here, the term "distance between a first transistor 10 and a first collector terminal" is defined as the shortest distance between the first transistor 10 and the first collector terminal. Also, the term "distance between a first transistor 10 and a second collector terminal" is defined as the shortest distance between the first transistor 10 and the second collector terminal. Also, the term "distance between a first transistor 10 and a first emitter terminal" is defined as the shortest distance between the first transistor 10 and the first emitter terminal. Also, the term "distance between a first transistor 10 and a second emitter terminal" is defined as the shortest distance between the first transistor 10 and the second emitter terminal.

In contrast, if only the first collector terminal PC1-1 is disposed, the difference between the distance to the first collector terminal PC1-1 from the first transistor 10(1), which is the closest to the first collector terminal PC1-1, and the distance to the first collector terminal PC1-1 from the first transistor 10(24), which is the farthest away from the first collector terminal PC1-1, is larger. In this embodiment, compared with a case where only the first collector terminal PC1-1 is disposed, the distance between the first collector terminal PC1-1 and the first transistor 10(12), which are the farthest away from each other, and the distance between the first collector terminal PC1-2 and the first transistor 10(13), which are the farthest away from each other, can be each reduced to about ½. This may suppress the phase variations of the respective power supply potentials Vcc supplied from the first collector terminals PC1-1 and PC1-2 to the plurality of first transistors 10 or the variations of the potentials due to the resistance component of the first collector line 11.

The first base line 12 is located between the plurality of first transistors 10 and an end portion of the semiconductor substrate 1. That is, the plurality of first transistors 10 are disposed between the first base line 12 and the first collector terminals PC1-1 and PC1-2 in the second direction Dy. The first base line 12 has an input portion 12a to which the input signal Pin is supplied.

Each of the first emitter terminals PE1-1 and PE1-2 has a substantially rectangular shape extending in the first direction Dx in plan view. The first emitter terminal PE1-1 and the first emitter terminal PE1-2 are located adjacent in the first direction Dx. The first emitter terminals PE1-1 and PE1-2 are disposed so as to overlap the plurality of first transistors 10 in plan view and are connected to the emitters of the plurality of first transistors 10. More specifically, the first emitter terminal PE1-1 is disposed so as to overlap the first transistors 10(1) to 10(12). The first emitter terminal PE1-2 is disposed so as to overlap the first transistors 10(13) to 10(24).

Note that the plurality of first emitter terminals PE1-1 and PE1-2 may not be disposed. A single first emitter terminal PE1 may be disposed so as to overlap the first transistors 10(1) to 10(24). Alternatively, three or more first emitter terminals PE1 may be disposed.

Each of the capacitors C1 is a parallel-plate capacitor having a first electrode 31 and a second electrode 32 that face each other. For example, an interlayer insulating film 56 (see FIGS. 3 and 4) is disposed between the first electrode 31 and the second electrode 32 as a dielectric layer, and a capacitance is formed between the first electrode 31 and the second electrode 32.

The two capacitors C1 are spaced apart from each other in the first direction Dx. One of the first electrode 31 or the second electrode 32 of each of the capacitors C1 is electrically connected to the collectors of the plurality of first transistors 10 via the first collector line 11. The other of the first electrode 31 or the second electrode 32 of each of the capacitors C1 is electrically connected to the emitters of the plurality of second transistors 20 via the second emitter line 23.

The capacitors C1 are located adjacent to the first collector terminals PC1-1 and PC1-2 in the first direction Dx. More specifically, the capacitors C1 are located between the first collector terminal PC1-1 and the first collector terminal PC1-2, between the second emitter terminal PE2-1 and the second emitter terminal PE2-2, and between the base terminal PB2-1 and the base terminal PB2-2 in the first direction Dx.

That is, the respective terminals (the first collector terminals PC1-1 and PC1-2, the second emitter terminals PE2-1 and PE2-2, and the base terminals PB2-1 and PB2-2) are not disposed between the capacitors C1 and the plurality of first transistors 10 and between the capacitors C1 and the plurality of second transistors 20 in the second direction Dy. This configuration can prevent interference from the various lines disposed on the semiconductor substrate 1. Accordingly, the terminals and the capacitors C1, which are connected to the plurality of first transistors 10 and the plurality of second transistors 20, can be efficiently placed on the same semiconductor substrate, i.e., the semiconductor substrate 1. Thus, the plurality of first transistors 10 and the plurality of second transistors 20, which are cascode-connected via the capacitors C1, are formed on the same semiconductor substrate, i.e., the semiconductor substrate 1.

The second collector terminals PC2-1 and PC2-2 are located between the plurality of second transistors 20 and an end portion of the semiconductor substrate 1. That is, the plurality of second transistors 20 are disposed between the second collector terminals PC2-1 and PC2-2 and the emitter and base terminals, namely, the second emitter terminals PE2-1 and PE2-2 and the base terminals PB2-1 and PB2-2, in the second direction Dy. The second collector terminals PC2-1 and PC2-2 are connected to a second collector line 21.

Each of the second collector terminals PC2-1 and PC2-2 has a substantially rectangular shape extending in the first direction Dx. The second collector terminal PC2-1 and the second collector terminal PC2-2 are located adjacent in the first direction Dx. The second collector terminal PC2-1 is adjacent to the second transistors 20(1) to 20(12) in the second direction Dy. The second collector terminal PC2-2 is adjacent to the second transistors 20(13) to 20(24) in the second direction Dy.

Note that the plurality of second collector terminals PC2-1 and PC2-2 may not be disposed. A single second collector terminal PC2 may be adjacent to the second transistors 20(1) to 20(24).

The base terminal PB2-1 is located between the first collector terminal PC1-1 and one of the capacitors C1 in the first direction Dx. The base terminal PB2-2 is located between the first collector terminal PC1-2 and the other capacitor C1 in the first direction Dx. In other words, the capacitors C1 are disposed between the two base terminals PB2-1 and PB2-2. The base terminals PB2-1 and PB2-2 are connected to the second base line 22 and are electrically connected to the bases of the plurality of second transistors 20. The base terminals PB2-1 and PB2-2, which are grounded, may be electrically connected to the first emitter terminals PE1-1 and PE1-2.

The second emitter terminals PE2-1 and PE2-2 are respectively located adjacent to the first collector terminals PC1-1 and PC1-2 in the second direction Dy. The plurality of first transistors 10, the first collector terminals PC1-1 and PC1-2, the second emitter terminals PE2-1 and PE2-2, and the plurality of second transistors 20 are located in the stated order in the second direction Dy.

As described above, the first inductors L1-1 and L1-2 are connected to the first collector terminals PC1-1 and PC1-2, respectively. The second inductors L2-1 and L2-2 are connected to the second emitter terminals PE2-1 and PE2-2, respectively. The first collector terminals PC1-1 and PC1-2 and the second emitter terminals PE2-1 and PE2-2 are disposed close to each other, respectively, thereby providing enhanced mutual inductance between the first inductor L1-1 and the second inductor L2-1 and enhanced mutual inductance between the first inductor L1-2 and the second inductor L2-2. Accordingly, the power amplifier apparatus 100 can increase maximum output power.

In addition, even if variations in inductance values occur between the first inductors L1-1 and L1-2 and the second inductors L2-1 and L2-2, the first inductor L1-1 and the second inductor L2-1 are coupled to each other and perform a function, and the first inductor L1-2 and the second inductor L2-2 are coupled to each other and perform a function. Accordingly, the first inductors L1-1 and L1-2 and the second inductors L2-1 and L2-2 can accomplish the choke function such that the respective inductance values can complement each other.

The second emitter terminal PE2-1 is located in the vicinity of the second transistor 20(1) positioned at a first end of the plurality of second transistors 20 in the first direction Dx. The second emitter terminal PE2-1 is connected to a first end 23e1 of the second emitter line 23 and is electrically connected to the emitters of the plurality of second transistors 20.

The second emitter terminal PE2-2 is located in the vicinity of the second transistor 20(24) positioned at a second end of the plurality of second transistors 20 in the first direction Dx. The second emitter terminal PE2-2 is connected to a second end 23e2 of the second emitter line 23 and is electrically connected to the emitters of the plurality of second transistors 20.

The two second emitter terminals PE2-1 and PE2-2 are disposed at both ends of the plurality of second transistors 20 arranged in the first direction Dx. Accordingly, similarly to the two first collector terminals PC1-1 and PC1-2 described above, the difference between the distances between each of the second emitter terminals PE2-1 and PE2-2 and the plurality of second transistors 20 can be reduced. This may suppress the phase variations of the respective signals (e.g., the collector-emitter currents) supplied to the plurality of second transistors 20 or the variations in the values of current due to the resistance component of the second emitter line 23.

The second emitter line 23 is disposed in a layer different from the layer in which the second base line 22 is disposed, such that the second emitter line 23 overlaps the second base line 22 in plan view. The first collector line 11, the first base line 12, the second collector line 21, the second base line 22, and the second emitter line 23 can be formed using lines in one or more layers disposed on the semiconductor substrate 1. The terminals, such as the first collector terminals PC1-1 and PC1-2 and the second emitter terminals PE2-1 and PE2-2, are disposed on the uppermost layer of the semiconductor substrate 1 and are exposed on the surface of the semiconductor substrate 1. The terminals and the capacitors C1 illustrated in FIG. 2 are substantially rectangular or substantially quadrilateral in shape in plan view, as a non-limiting example. The terminals and the capacitors C1 may be substantially polygonal, substantially circular, or in any other shape in plan view.

Figure 3:
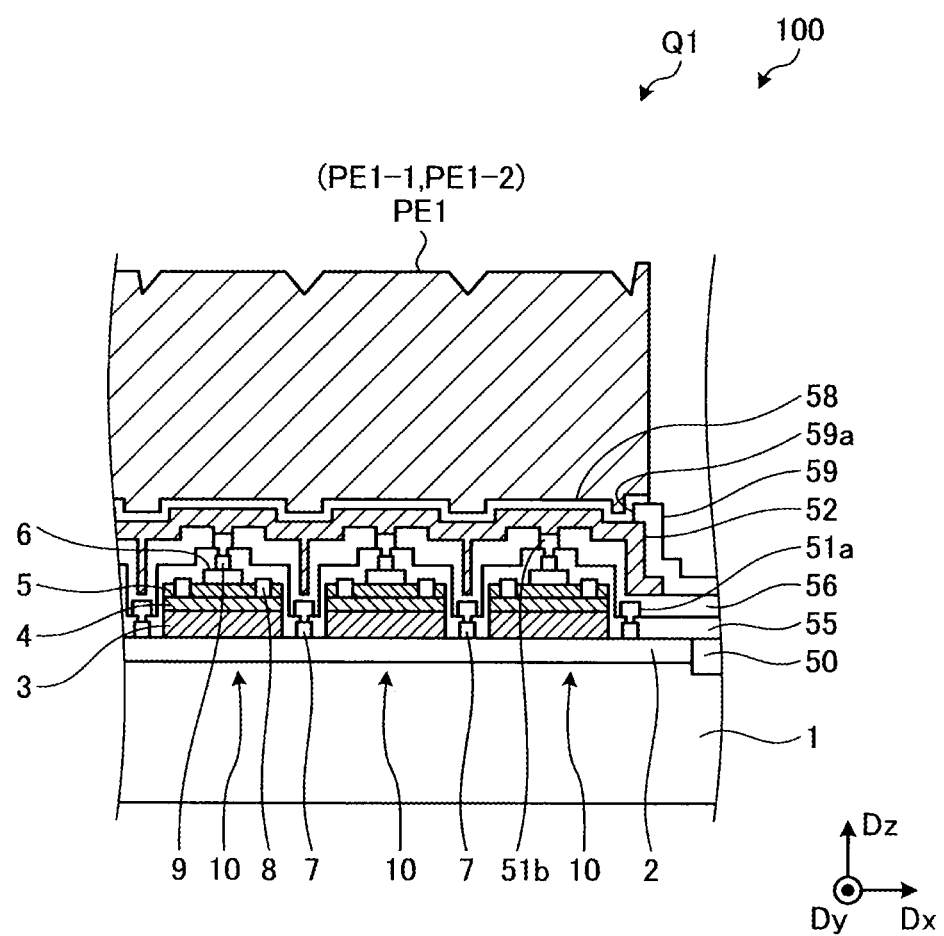
FIG. 3 is a sectional view taken along line III-III' of FIG. 2.
Figure 4:
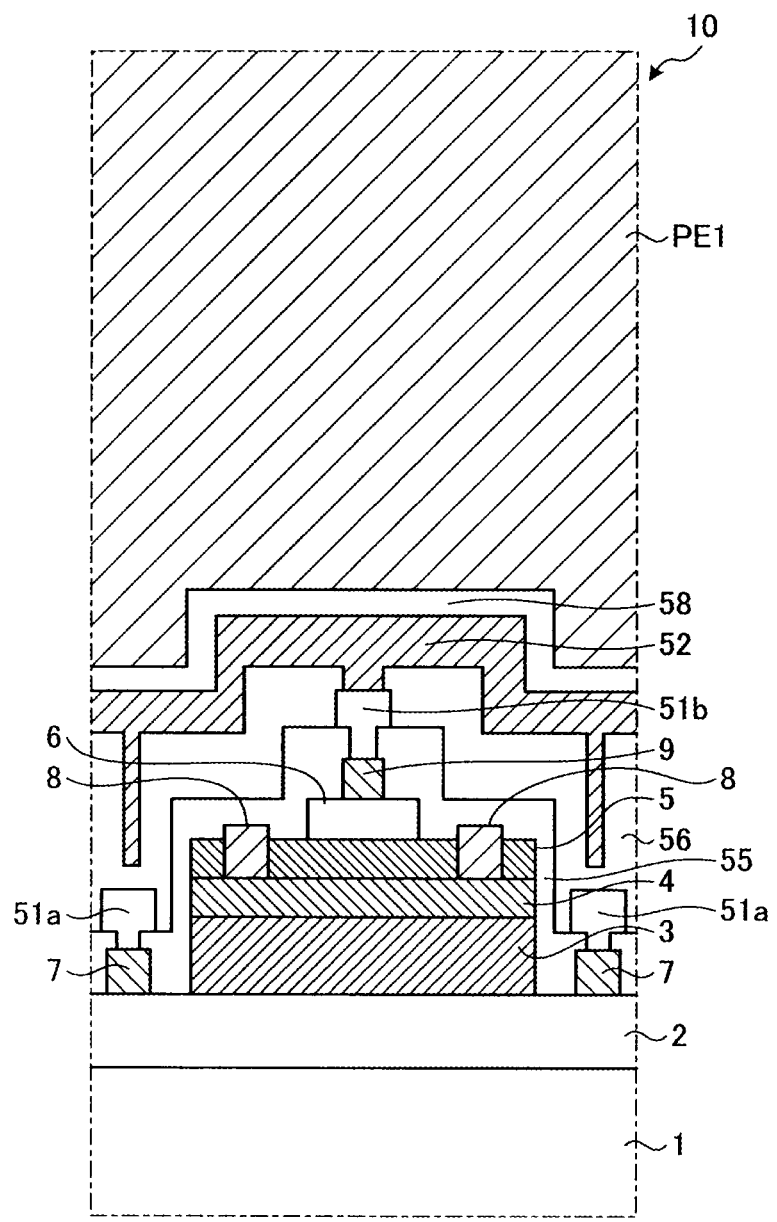
FIG. 4 is a sectional view of a first transistor.

Next, the sectional configuration of the power amplifier apparatus 100 will be described. FIG. 3 is a sectional view taken along line III-III' of FIG. 2. FIG. 4 is a sectional view of a first transistor. In FIG. 3, the sectional configuration of some of the plurality of first transistors 10 is illustrated. In FIGS. 3 and 4, the sectional configuration of the first transistor(s) 10 is illustrated. The second transistors 20 also have similar sectional configurations. That is, the description of the first transistor(s) 10 described with reference to FIGS. 3 and 4 is also applicable to the second transistors 20.

As illustrated in FIG. 3, the plurality of first transistors 10 included in the first transistor group Q1 are disposed on the semiconductor substrate 1. The semiconductor substrate 1 is composed of, for example, semi-insulating gallium arsenide (GaAs). In an end portion of the first transistor group Q1, the semiconductor substrate 1 and a sub-collector layer 2 are provided with an isolation region 50. The isolation region 50 is a region corresponding to an insulating portion of the semiconductor substrate 1 and the sub-collector layer 2 that is formed by ion implantation. The isolation region 50 electrically isolates the first transistor group Q1 and the second transistor group Q2 from each other.

As illustrated in FIGS. 3 and 4, the first transistor 10 includes the sub-collector layer 2, a collector layer 3, a base layer 4, an emitter layer 5, a first contact layer 6, and various electrodes and lines. The sub-collector layer 2, the collector layer 3, the base layer 4, the emitter layer 5, and the first contact layer 6 are stacked on the semiconductor substrate 1 in the stated order.

The sub-collector layer 2 is disposed on the semiconductor substrate 1. The collector layer 3 is disposed on the sub-collector layer 2. The sub-collector layer 2 functions as the collector of the first transistor 10 together with the collector layer 3. The sub-collector layer 2 and the collector layer 3 are composed of, for example, n-type semiconductor containing GaAs as a main component.

The base layer 4 is disposed on the collector layer 3. The base layer 4 is composed of, for example, p-type semiconductor containing GaAs as a main component.

The emitter layer 5 is disposed on the base layer 4. The emitter layer 5 is composed of, for example, n-type semiconductor containing InGaP as a main component.

The first contact layer 6 is disposed on the emitter layer 5. The first contact layer 6 is composed of, for example, n-type semiconductor containing GaAs as a main component.

Two collector electrodes 7 are disposed on the sub-collector layer 2, with the collector layer 3 interposed therebetween in the first direction Dx. The collector electrodes 7 are shared by adjacent first transistors 10. That is, one collector electrode 7 is disposed between adjacent first transistors 10 and is electrically connected to the adjacent first transistors 10.

As illustrated in FIG. 4, two base electrodes 8 are disposed on the base layer 4. The first contact layer 6 is disposed between the two base electrodes 8 in plan view. An emitter electrode 9 is disposed on the first contact layer 6.

A protection film 55 is disposed to cover the sub-collector layer 2, the collector layer 3, the base layer 4, the emitter layer 5, the first contact layer 6, and various electrodes. First lines 51a and 51b are disposed on the protection film 55. The first line 51a is connected to the collector electrodes 7 via through-holes in the protection film 55. The first line 51b is connected to the emitter electrode 9 via a through-hole in the protection film 55.

The interlayer insulating film 56 is disposed on the protection film 55 in such a manner as to cover the first lines 51a and 51b. A second line 52 is disposed on the interlayer insulating film 56. The second line 52 is connected to the first line 51b via a through-hole in the interlayer insulating film 56. Accordingly, the second line 52 is electrically connected to the emitter electrode 9 via the first line 51b.

The protection film 55 and the interlayer insulating film 56 are composed of, for example, SiN. The first lines 51a and 51b and the second line 52 are composed of, for example, Au.

The first emitter terminal PE1 is disposed on the second line 52 with a lower metal layer 58 interposed therebetween. As illustrated in FIG. 3, a protection film 59 is disposed on the interlayer insulating film 56. The protection film 59 covers an edge of the second line 52. The first emitter terminal PE1 is disposed at a position that overlaps an opening 59a in the protection film 59. The second line 52 and the first emitter terminal PE1 are disposed across the plurality of first transistors 10 and are electrically connected to a plurality of the emitter electrodes 9. The first emitter terminal PE1 is, for example, a Cu pillar bump, which is formed by using electroplating. Note that the first emitter terminal PE1 may be, for example, a solder bump or a stud bump and composed of any other metal material such as Au. The lower metal layer 58 is composed of, for example, Ti/Cu and is a seed electrode for plating to form the first emitter terminal PE1.

As illustrated in FIG. 2, since the second emitter terminals PE2-1 and PE2-2 are disposed in regions that do not overlap the second transistors 20, the protection film 59 is disposed in such a manner as to cover the second line 52 of the second transistors 20 in the sectional configuration of the second transistor 20.

The sectional configuration and the materials illustrated FIGS. 3 and 4 are for illustrative purposes only and may be changed as desired. The various lines, such as the first collector line 11, the first base line 12, the second collector line 21, the second base line 22, and the second emitter line 23, and the first electrodes 31 and the second electrodes 32 of the capacitors C1 illustrated in FIG. 2 may be formed of lines or electrodes in the same layer as that of the first lines 51a and 51b and the second line 52, for example. Alternatively, the various lines and the electrodes may be formed in a layer different from that of the first lines 51a and 51b and the second line 52.

Second Embodiment

Figure 5:
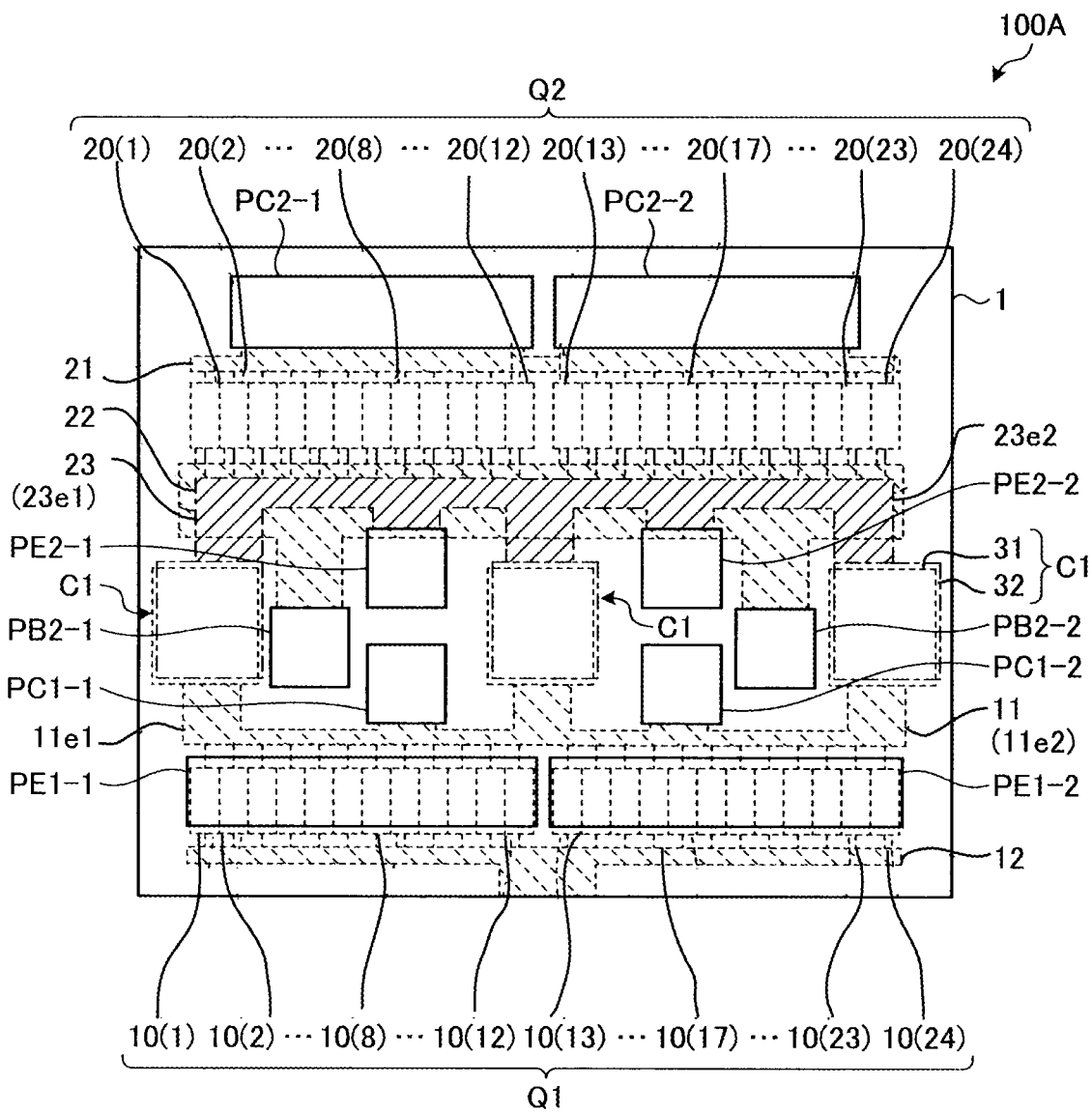
FIG. 5 is a plan view of a power amplifier apparatus according to a second embodiment.
Figure 5:
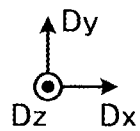

FIG. 5 is a plan view of a power amplifier apparatus according to a second embodiment. In the following description, substantially the same components as those of the embodiment described above are identified by the same reference numerals and will not be described. In the second embodiment, unlike the first embodiment described above, the first collector terminals PC1-1 and PC1-2 are disposed at positions close to a center portion, instead of positions close to both ends of the plurality of first transistors 10, in the first direction Dx. In the second embodiment, the second emitter terminals PE2-1 and PE2-2 are also disposed at positions close to a center portion, instead of positions close to both ends of the plurality of second transistors 20, in the first direction Dx. The term "center" refers to the position of the center of gravity of the semiconductor substrate 1, and the term "center portion" refers to an area between the center of gravity and an end portion of the semiconductor substrate 1 in the first direction Dx and the second direction Dy.

As illustrated in FIG. 5, in a power amplifier apparatus 100A, the first collector terminal PC1-1 is disposed in the vicinity of the first transistor 10(8) among the plurality of first transistors 10, for example. The first transistor 10(8) is located between the first transistor 10(1) positioned at the first end in the first direction Dx and the first transistor 10(12) positioned in the center portion in the first direction Dx. In addition, among the plurality of first transistors 10, the distance between the first transistor 10(1) positioned at the first end in the first direction Dx and the first collector terminal PC1-1 is larger than the distance between the first transistor 10(12) positioned in the center portion in the first direction Dx and the first collector terminal PC1-1.

The first collector terminal PC1-2 is disposed in the vicinity of the first transistor 10(17) among the plurality of first transistors 10, for example. The first transistor 10(17) is located between the first transistor 10(24) positioned at the second end in the first direction Dx and the first transistor 10(13) positioned in the center portion in the first direction Dx. In addition, among the plurality of first transistors 10, the distance between the first transistor 10(24) positioned at the second end in the first direction Dx and the first collector terminal PC1-2 is larger than the distance between the first transistor 10(13) positioned in the center portion in the first direction Dx and the first collector terminal PC1-2.

In the second embodiment, the distances between the first transistors 10(1) and 10(24), which are the farthest away from the first collector terminals PC1-1 and PC1-2, respectively, and the first collector terminals PC1-1 and PC1-2 are smaller than those in the first embodiment. In other words, the difference between the distance to the first collector terminal PC1-1 from the first transistor 10(8), which is the closest to the first collector terminal PC1-1, and the distance to the first collector terminal PC1-1 from the first transistor 10(1), which is the farthest away from the first collector terminal PC1-1, can be reduced, and the difference between the distance to the first collector terminal PC1-2 from the first transistor 10(17), which is the closest to the first collector terminal PC1-2, and the distance to the first collector terminal PC1-2 from the first transistor 10(24), which is the farthest away from the first collector terminal PC1-2, can be reduced. The distances between each of the first collector terminals PC1-1 and PC1-2 and the first transistors 10 are reduced, and the parasitic capacitance or inductance on the lines can be reduced accordingly, resulting in the same distribution of parasitic elements in the first collector terminals PC1-1 and PC1-2. A symmetrical arrangement of parasitic elements in layout is achieved. It is therefore possible to reduce asymmetry in characteristics due to the difference between the first collector terminals PC1-1 and PC1-2.

The second emitter terminal PE2-1 is disposed in the vicinity of the second transistor 20(8) among the plurality of second transistors 20, for example. The second transistor 20(8) is located between the second transistor 20(1) positioned at the first end in the first direction Dx and the second transistor 20(12) positioned in the center portion in the first direction Dx. In addition, among the plurality of second transistors 20, the distance between the second transistor 20(1) positioned at the first end in the first direction Dx and the second emitter terminal PE2-1 is larger than the distance between the second transistor 20(12) positioned in the center portion in the first direction Dx and the second emitter terminal PE2-1.

The second emitter terminal PE2-2 is disposed in the vicinity of the second transistor 20(17) among the plurality of second transistors 20, for example. The second transistor 20(17) is located between the second transistor 20(24) positioned at the second end in the first direction Dx and the second transistor 20(13) positioned in the center portion in the first direction Dx. In addition, among the plurality of second transistors 20, the distance between the second transistor 20(24) positioned at the second end in the first direction Dx and the second emitter terminal PE2-2 is larger than the distance between the second transistor 20(13) positioned in the center portion in the first direction Dx and the second emitter terminal PE2-2.

Also in the second emitter terminals PE2-1 and PE2-2, like the first collector terminals PC1-1 and PC1-2, the distances between the second transistors 20(1) and 20(24), which are the farthest away from the second emitter terminals PE2-1 and PE2-2, respectively, and the second emitter terminals PE2-1 and PE2-2 are smaller than those in the first embodiment. In other words, the difference between the distance to the second emitter terminal PE2-1 from the second transistor 20(8), which is the closest to the second emitter terminal PE2-1, and the distance to the second emitter terminal PE2-1 from the second transistor 20(1), which is the farthest away from the second emitter terminal PE2-1, can be reduced, and the difference between the distance to the second emitter terminal PE2-2 from the second transistor 20(17), which is the closest to the second emitter terminal PE2-2, and the distance to the second emitter terminal PE2-2 from the second transistor 20(24), which is the farthest away from the second emitter terminal PE2-2, can be reduced. The distances between each of the second emitter terminals PE2-1 and PE2-2 and the second transistors 20 are reduced, and the parasitic capacitance or inductance on the lines can be reduced accordingly, resulting in the same distribution of parasitic elements in the second emitter terminals PE2-1 and PE2-2. A symmetrical arrangement of parasitic elements in layout is achieved. It is therefore possible to reduce asymmetry in characteristics due to the difference between the second emitter terminals PE2-1 and PE2-2.

In addition, the power amplifier apparatus 100A includes three capacitors C1. The three capacitors C1 are arranged in the first direction Dx. One of the three capacitors C1 is located in the vicinity of, among the plurality of first transistors 10, the first transistor 10(1) positioned at the first end in the first direction Dx, another capacitor C1 is located in the vicinity of the first transistors 10(12) and 10(13) positioned in the center portion in the first direction Dx, and the other capacitor C1 is located in the vicinity of the first transistor 10(24) positioned at the second end in the first direction Dx.

In plan view in the third direction Dz, the plurality of first collector terminals PC1-1 and PC1-2 are disposed between the two capacitors C1 positioned at both ends in the first direction Dx. More specifically, one of the three capacitors C1, the base terminal PB2-1, a group of the first collector terminal PC1-1 and the second emitter terminal PE2-1, another of the three capacitors C1, a group of the first collector terminal PC1-2 and the second emitter terminal PE2-2, the base terminal PB2-2, and the other capacitor C1 are arranged in the stated order in the first direction Dx.

With the configuration described above, even when the first collector terminals PC1-1 and PC1-2 and the second emitter terminals PE2-1 and PE2-2 are placed at positions close to the center portion, instead of positions close to both ends, in the first direction Dx, the capacitance of the capacitor C1 can be maintained. Consequently, the plurality of first transistors 10 and the plurality of second transistors 20 are cascode-connected via the plurality of capacitors C1.

The locations of the terminals and the capacitors C1 illustrated in FIG. 5 may be changed as desired. For example, one or two capacitors C1 may be disposed. Further, the positions of the first collector terminals PC1-1 and PC1-2, the second emitter terminals PE2-1 and PE2-2, and the base terminals PB2-1 and PB2-2 in the first direction Dx may be interchanged. That is, the configuration in which the first collector terminals PC1-1 and PC1-2 and the second emitter terminals PE2-1 and PE2-2 are disposed between the two base terminals PB2-1 and PB2-2 is not to be construed as limiting. As an alternative, the base terminals PB2-1 and PB2-2 may be disposed between the two first collector terminals PC1-1 and PC1-2 and between the two second emitter terminals PE2-1 and PE2-2.

Third Embodiment

Figure 6:
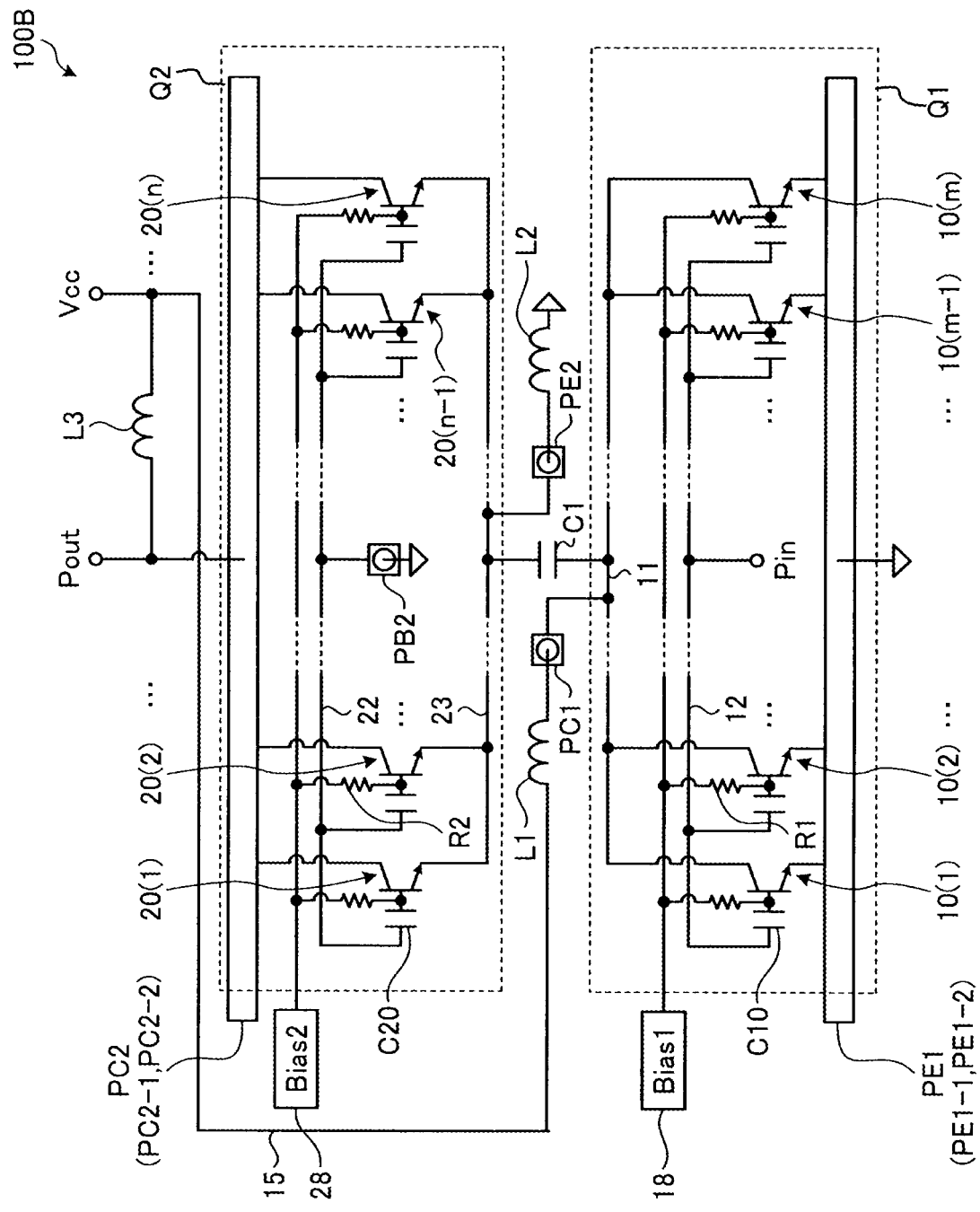
FIG. 6 is a circuit diagram illustrating a power amplifier apparatus according to a third embodiment.
Figure 7:
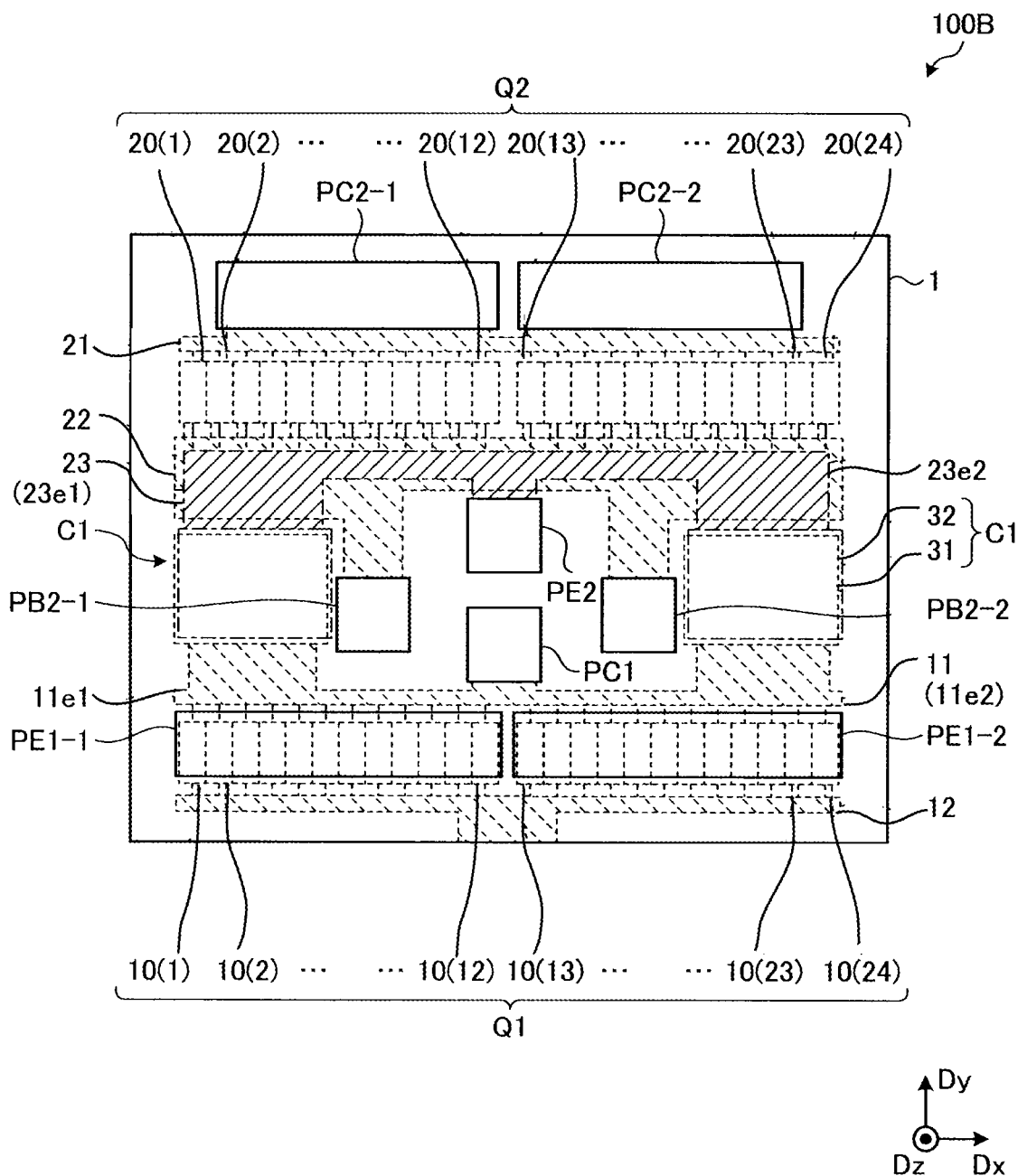
FIG. 7 is a plan view of the power amplifier apparatus according to the third embodiment.

FIG. 6 is a circuit diagram illustrating a power amplifier apparatus according to a third embodiment. FIG. 7 is a plan view of the power amplifier apparatus according to the third embodiment. In the third embodiment, unlike the first and second embodiments, a single first collector terminal PC1 and a single second emitter terminal PE2 are disposed.

As illustrated in FIG. 6, in a power amplifier apparatus 100B according to the third embodiment, the first collector terminal PC1 is electrically connected to a center portion of the first collector line 11. The power supply potential Vcc is supplied to the first collector terminal PC1 via a first inductor L1 and the first power feed line 15. Accordingly, the power supply potential Vcc is supplied to the collectors of the plurality of first transistors 10.

The second emitter terminal PE2 is connected to a center portion of the second emitter line 23. The emitters of the plurality of second transistors 20 are grounded via the second emitter terminal PE2 and a second inductor L2.

Also in this embodiment, the plurality of first transistors 10 and the plurality of second transistors 20, which are cascode-connected, operate in a manner similar to that according to the first embodiment described above. That is, the collector-emitter currents of the plurality of first transistors 10 flow through a path formed by the single first collector terminal PC1, the first collector line 11, the parallel-connected plurality of first transistors 10, and the first emitter terminal PE1. The collector-emitter currents of the plurality of second transistors 20 flow through a path formed by the second collector terminal PC2, the parallel-connected plurality of second transistors 20, the second emitter line 23, and the single second emitter terminal PE2.

As illustrated in FIG. 7, the first collector terminal PC1 and the second emitter terminal PE2 are located adjacent in the second direction Dy. The first collector terminal PC1 is disposed in the vicinity of the first transistors 10(12) and 10(13) positioned in the center portion in the first direction Dx among the plurality of first transistors 10.

Also in the third embodiment, compared with the configuration in which the first collector terminal PC1 is disposed only at the first end of the plurality of first transistors 10, the difference between the distances between the first collector terminal PC1 and the plurality of first transistors 10 can be reduced. That is, the difference between the distance to the first collector terminal PC1 from the first transistors 10(12) and 10(13), which are the closest to the first collector terminal PC1, and the distance to the first collector terminal PC1 from the first transistors 10(1) and 10(24), which are the farthest away from the first collector terminal PC1, can be reduced. Accordingly, the parasitic capacitance or inductance on the line between the first collector terminal PC1 and the first transistors 10(1) and 10(24) can be reduced. For example, the distance between the first collector terminal PC1 and each of the first transistors 10(1) and 10(24), which is the farthest away from the first collector terminal PC1, is substantially the same as the distance between the first collector terminal PC1-1 and the first transistor 10(12) and the distance between the first collector terminal PC1-2 and the first transistor 10(13) in the first embodiment (see FIG. 2).

The second emitter terminal PE2 is disposed in the vicinity of the second transistors 20(12) and 20(13) positioned in the center portion in the first direction Dx among the plurality of second transistors 20. Thus, like the single first collector terminal PC1 described above, the difference between the distances between the second emitter terminal PE2 and the plurality of second transistors 20 can be reduced. Accordingly, the parasitic capacitance or inductance on the line between the second emitter terminal PE2 and the second transistors 20(12) and 20(13) can be reduced.

The power amplifier apparatus 100B includes two capacitors C1. One of the two capacitors C1 is located in the vicinity of the first transistor 10(1) positioned at the first end in the first direction Dx among the plurality of first transistors 10, and the other capacitor C1 is located in the vicinity of the first transistor 10(24) positioned at the second end in the first direction Dx.

In plan view in the third direction Dz, the single first collector terminal PC1, the single second emitter terminal PE2, and the two base terminals PB2-1 and PB2-2 are disposed between the plurality of capacitors C1. More specifically, one of the capacitors C1, the base terminal PB2-1, the group of the first collector terminal PC1 and the second emitter terminal PE2, the base terminal PB2-2, and the other capacitor C1 are arranged in the stated order in the first direction Dx.

In this embodiment, the number of terminals on the semiconductor substrate 1 can be smaller than those in the first and second embodiments. In the power amplifier apparatus 100B, accordingly, the semiconductor substrate 1 can have a small area in plan view. In the power amplifier apparatus 100B, furthermore, the flexibility of the layout of a plurality of terminals, various lines, and the capacitors C1 on the semiconductor substrate 1 can improve.

Fourth Embodiment

Figure 8:
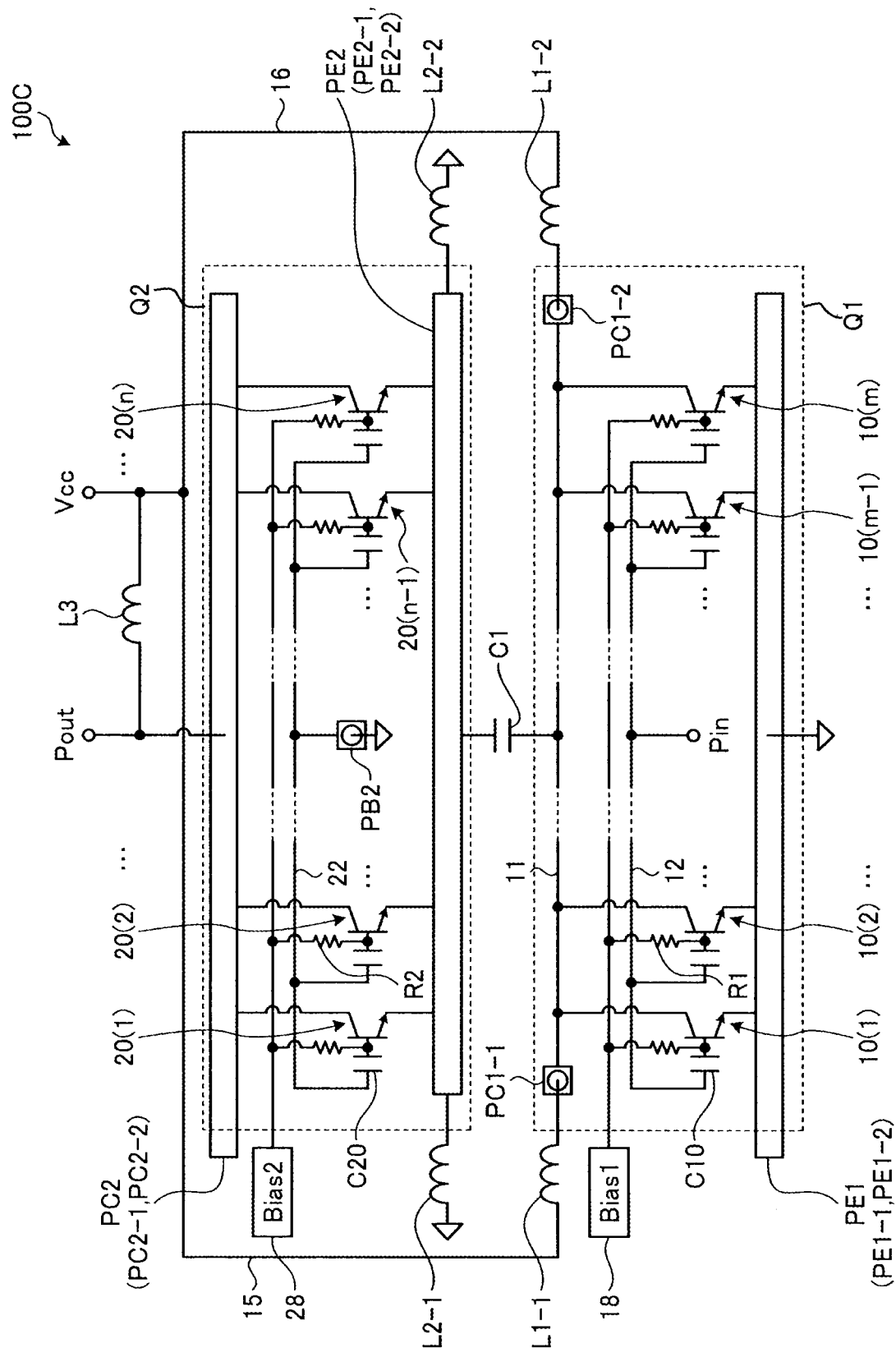
FIG. 8 is a circuit diagram illustrating a power amplifier apparatus according to a fourth embodiment.
Figure 9:
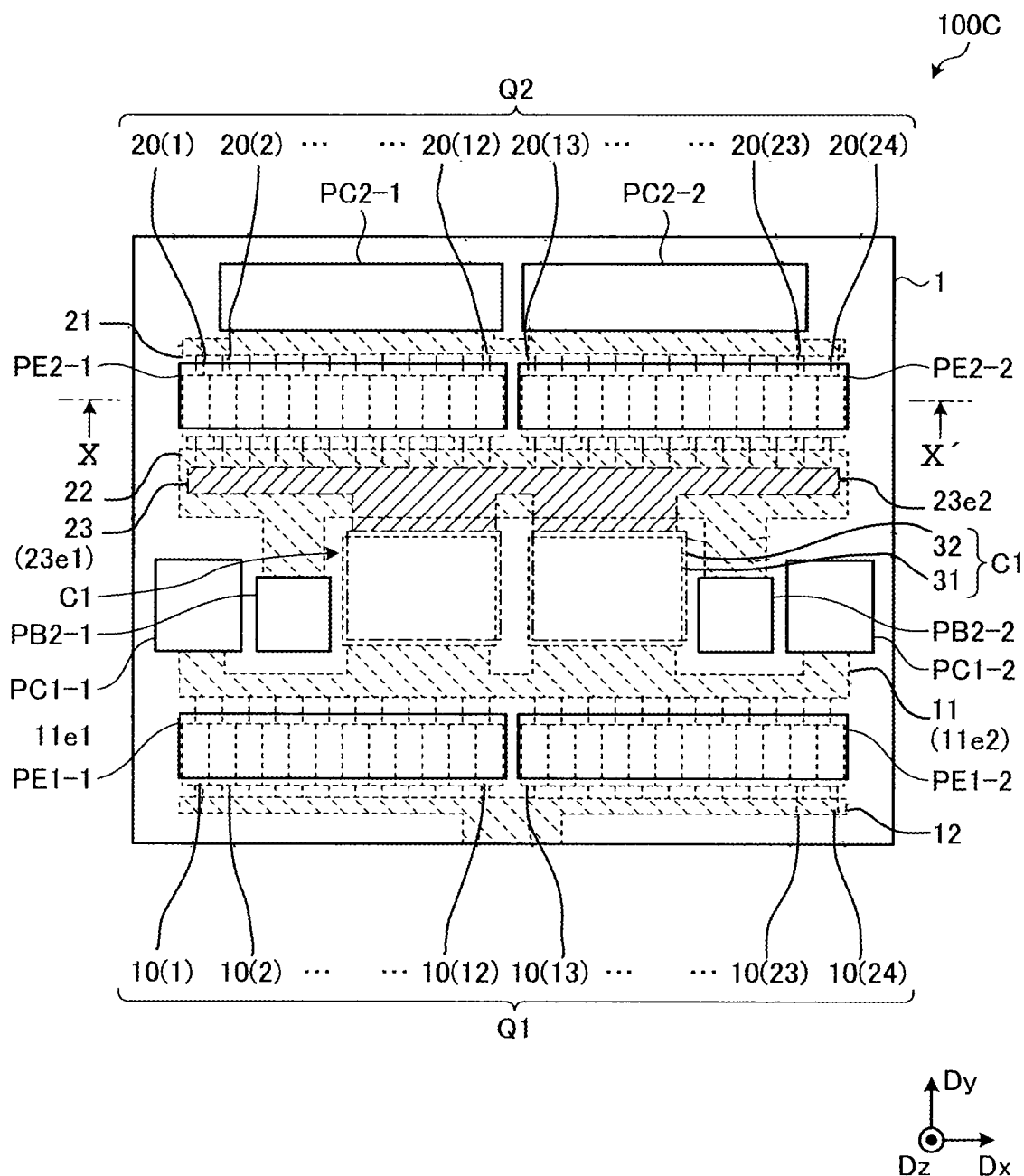
FIG. 9 is a plan view of the power amplifier apparatus according to the fourth embodiment.
Figure 10:
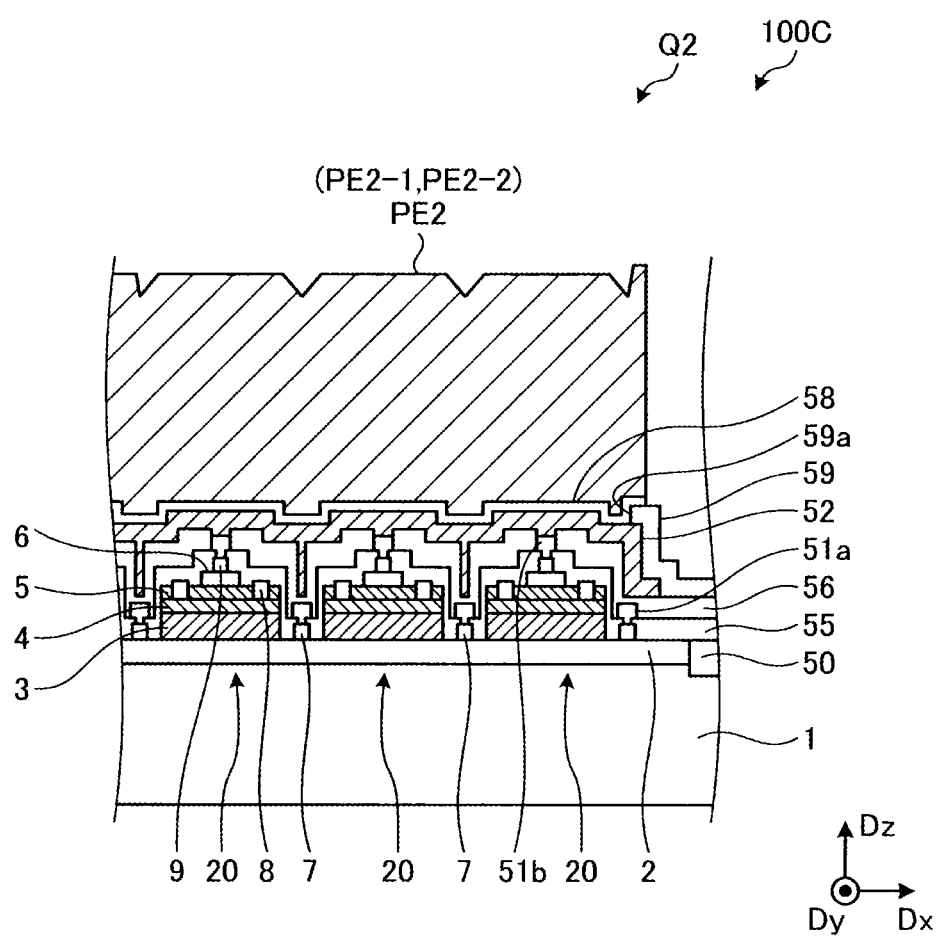
FIG. 10 is a sectional view taken along line X-X' of FIG. 9.

FIG. 8 is a circuit diagram illustrating a power amplifier apparatus according to a fourth embodiment. FIG. 9 is a plan view of the power amplifier apparatus according to the fourth embodiment. FIG. 10 is a sectional view taken along line X-X' of FIG. 9. In the fourth embodiment, unlike the first to third embodiments, the second emitter terminal PE2 is disposed on the plurality of second transistors 20.

As illustrated in FIG. 8, in a power amplifier apparatus 100C according to the fourth embodiment, the emitters of the plurality of second transistors 20 are connected to a common second emitter terminal PE2. A first end of the second emitter terminal PE2 is grounded via the second inductor L2-1. A second end of the second emitter terminal PE2 is grounded via the second inductor L2-2. The collector-emitter currents of the plurality of second transistors 20 flow through a path formed by the second collector terminal PC2, the parallel-connected plurality of second transistors 20, and the second emitter terminal PE2.

As illustrated in FIG. 9, the second emitter terminal PE2 is constituted by two second emitter terminals PE2-1 and PE2-2. Each of the second emitter terminals PE2-1 and PE2-2 has a substantially rectangular shape extending in the first direction Dx in plan view. The second emitter terminal PE2-1 and the second emitter terminal PE2-2 are located adjacent in the first direction Dx. The second emitter terminals PE2-1 and PE2-2 are disposed so as to overlap the plurality of second transistors 20 in plan view and are connected to the emitters of the plurality of second transistors 20.

More specifically, the second emitter terminal PE2-1 is disposed so as to overlap the second transistors 20(1) to 20(12). The second emitter terminal PE2-2 is disposed so as to overlap the second transistors 20(13) to 20(24).

Note that the plurality of second emitter terminals PE2-1 and PE2-2 may not be disposed. A single second emitter terminal PE2 may be disposed so as to overlap the second transistors 20(1) to 20(24). Alternatively, three or more second emitter terminals PE2 may be disposed.

As illustrated in FIG. 10, the second emitter terminal PE2 is disposed directly above the plurality of second transistors 20. The second emitter terminal PE2 is disposed on the second line 52 with the lower metal layer 58 interposed therebetween. The second line 52 and the second emitter terminal PE2 disposed across the plurality of second transistors 20 and are electrically connected to the plurality of emitter electrodes 9.

In this embodiment, the second emitter terminal PE2 is disposed directly above the plurality of second transistors 20 and has a larger area than the second emitter terminals PE2-1 and PE2-2 according to the first to third embodiments described above. Thus, heat generated by the plurality of second transistors 20 is well transmitted to the second emitter terminal PE2. The heat transmitted to the second emitter terminal PE2 is radiated outside the power amplifier apparatus 100C. The first emitter terminal PE1 can also well release the heat generated by the plurality of first transistors 10 to the outside. Accordingly, the power amplifier apparatus 100C has good heat radiation characteristics.

As illustrated in FIG. 9, the first collector terminals PC1-1 and PC1-2 are respectively located adjacent to the second emitter terminals PE2-1 and PE2-2 in the second direction Dy. The two base terminals PB2-1 and PB2-2 and the two capacitors C1 are located between the first collector terminals PC1-1 and PC1-2 adjacent to each other in the first direction Dx.

In this embodiment, the second emitter terminal PE2 is disposed directly above the plurality of second transistors 20. This configuration can improve the flexibility of the layout of the other terminals and the capacitor C1, compared with the first to third embodiments described above. Specifically, in the power amplifier apparatus 100C, the area of the first collector terminals PC1-1 and PC1-2 in plan view can be larger than that of the base terminals PB2-1 and PB2-2.

With the configuration described above, the resistance components of the first collector terminals PC1-1 and PC1-2 can be reduced. As a result, the power amplifier apparatus 100C can prevent a reduction in the collector-emitter currents of the first transistors 10. In other words, the first transistors 10 can have high current-carrying capacity. In addition, due to the large area of the first collector terminals PC1-1 and PC1-2, the effect of heat radiation from the first collector terminals PC1-1 and PC1-2 to the outside is improved.

Modification of Fourth Embodiment

Figure 11:
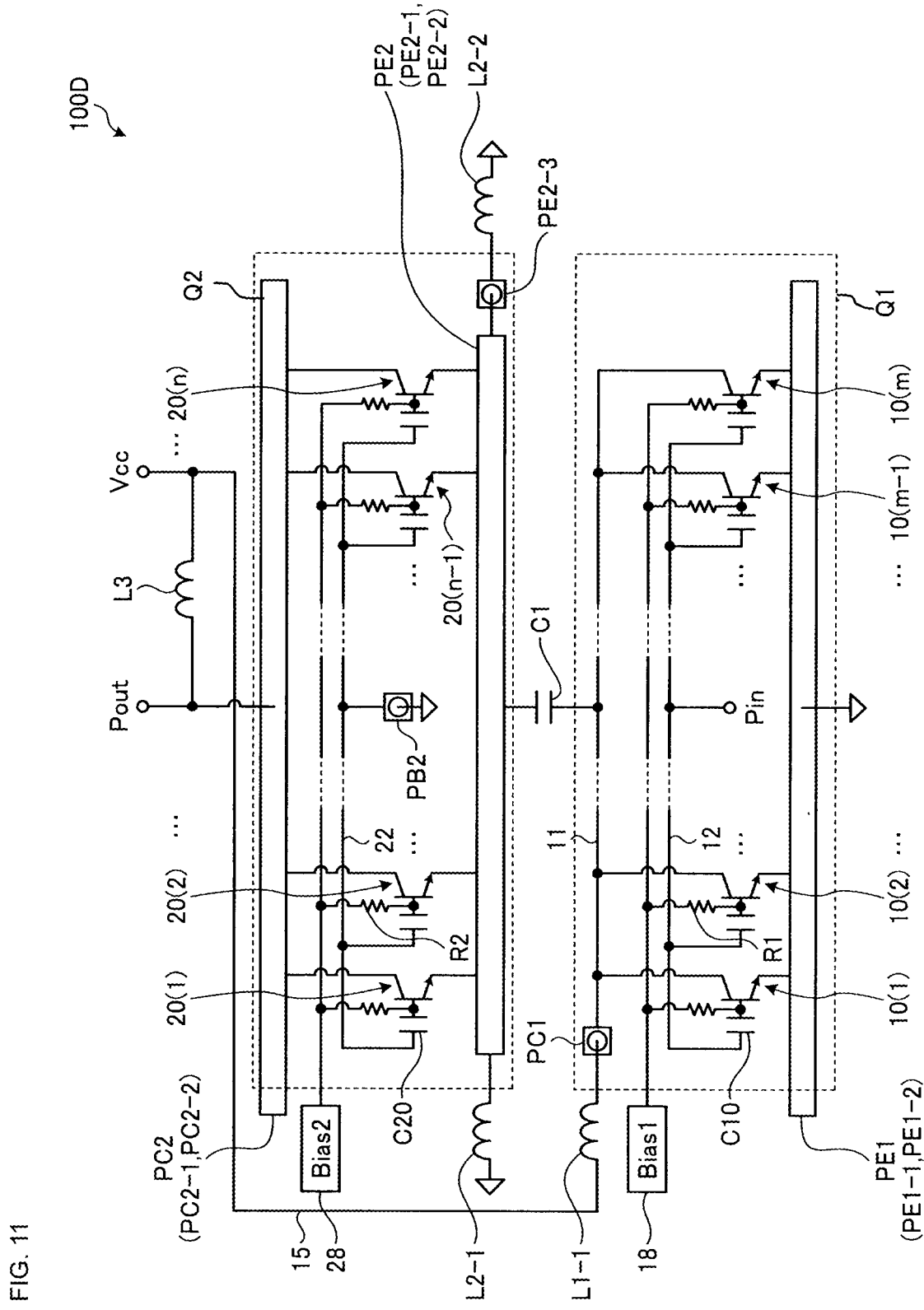
FIG. 11 is a circuit diagram illustrating a power amplifier apparatus according to a modification of the fourth embodiment.
Figure 12:
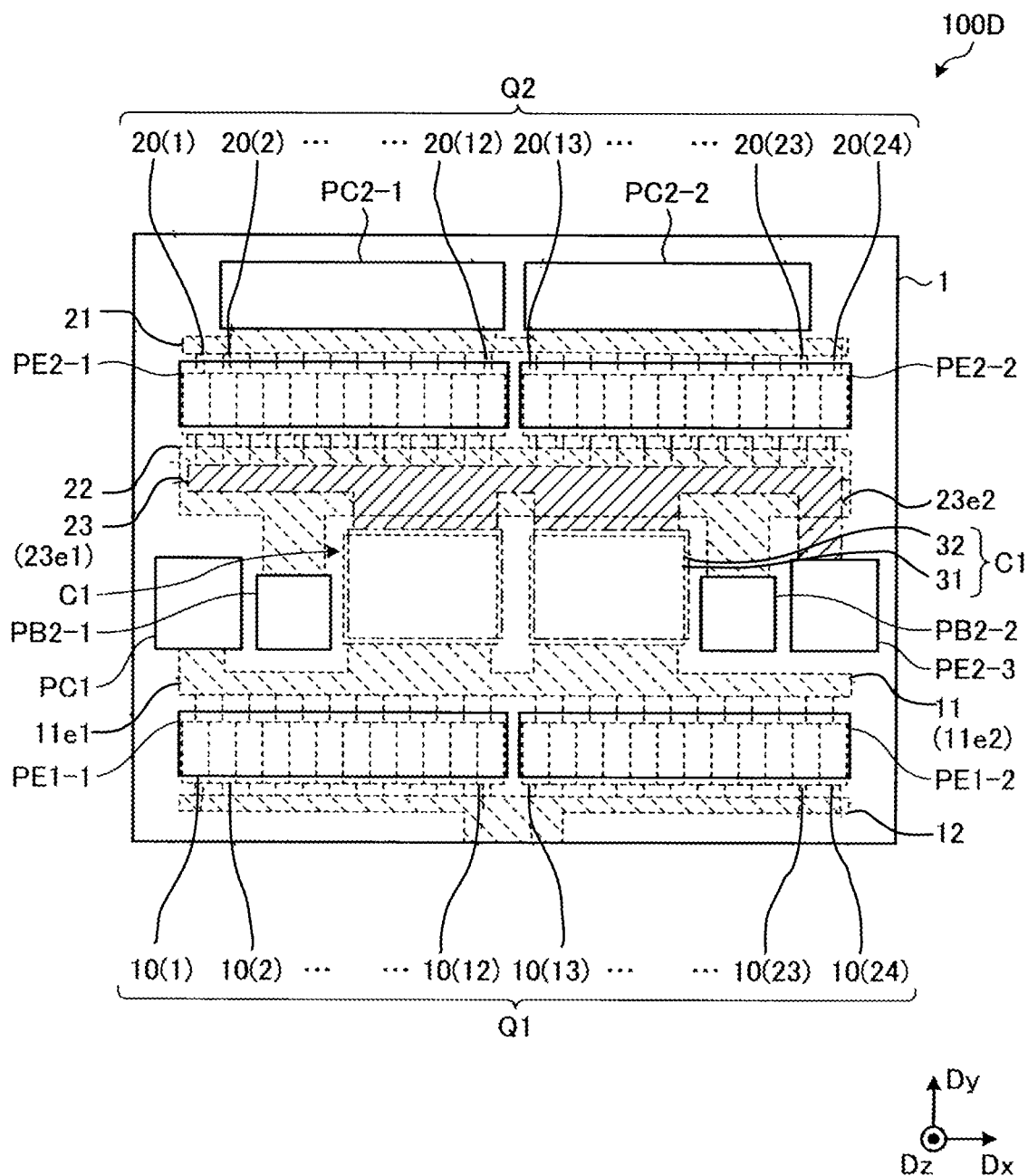
FIG. 12 is a plan view of the power amplifier apparatus according to the modification of the fourth embodiment.

FIG. 11 is a circuit diagram illustrating a power amplifier apparatus according to a modification of the fourth embodiment. FIG. 12 is a plan view of the power amplifier apparatus according to the modification of the fourth embodiment. Unlike the fourth embodiment described above, a power amplifier apparatus 100D according to the modification has a single first collector terminal PC1.

As illustrated in FIG. 11, the first collector terminal PC1 is connected to a first end of the first collector line 11. The power supply potential Vcc is supplied to the first collector terminal PC1 via the first inductor L1-1 and the first power feed line 15. Accordingly, the power supply potential Vcc is supplied the collectors of the plurality of first transistors 10.

The power amplifier apparatus 100D further has a second emitter terminal PE2-3 in addition to the second emitter terminal PE2 (the second emitter terminals PE2-1 and PE2-2). The second emitter terminal PE2-3 is connected to the second emitter terminal PE2. A first end of the second emitter terminal PE2 is grounded via the second inductor L2-1, and a second end of the second emitter terminal PE2 is grounded via the second emitter terminal PE2-3 and the second inductor L2-2.

As illustrated in FIG. 12, the second emitter terminal PE2-3 is located adjacent to the second emitter terminal PE2-2 in the second direction Dy. The second emitter terminal PE2-3 is electrically connected to the plurality of second transistors 20 via the second emitter line 23. In this modification, the second emitter terminals PE2-1 and PE2-2 disposed directly above the plurality of second transistors 20, and the second emitter terminal PE2-3 disposed at a position different from the positions of the second emitter terminals PE2-1 and PE2-2 are provided. In plan view, the area of the second emitter terminal PE2-3 is larger than the area of each of the base terminals PB2-1 and PB2-2. With this configuration, the power amplifier apparatus 100D have improved heat radiation characteristics.

The embodiments described above are provided to facilitate understanding of the present disclosure and are not to be construed as limiting the present disclosure. The present disclosure may be modified or improved without necessarily departing from the spirit thereof, and the present disclosure also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier apparatus comprising:
a semiconductor substrate;
a plurality of first transistors along a first direction on the semiconductor substrate;
a plurality of second transistors along the first direction on the semiconductor substrate, and separated from the plurality of first transistors in a second direction perpendicular to the first direction;
at least one collector terminal electrically connected to collectors of the plurality of first transistors;
a first inductor having a first end electrically connected to the at least one collector terminal and a second end electrically connected to a power supply potential;
at least one emitter terminal electrically connected to emitters of the plurality of second transistors, the at least one emitter terminal being adjacent to a corresponding one of the at least one collector terminals in the second direction on the semiconductor substrate;
a second inductor having a first end electrically connected to the at least one emitter terminal and a second end electrically connected to a reference potential; and
at least one capacitor having a first end electrically connected to the collectors of the plurality of first transistors and a second end electrically connected to the emitters of the plurality of second transistors.

2. The power amplifier apparatus according to claim 1, wherein:
the at least one collector terminal comprises at least two collector terminals, and
as seen in a plan view of the semiconductor substrate, a first of the at least two collector terminals is at a first end of the plurality of first transistors, and a second of the at least two collector terminals is at a second end of the plurality of first transistors, the second end being an opposite end to the first end in the first direction.

3. The power amplifier apparatus according to claim 1, wherein:
the at least one emitter terminal comprises at least two emitter terminals, and
as seen in a plan view of the semiconductor substrate, a first of the at least two emitter terminals is at a first end of the plurality of second transistors, and a second of the at least two emitter terminals is at a second end of the plurality of second transistors, the second end being an opposite end to the first end in the first direction.

4. The power amplifier apparatus according to claim 2, wherein as seen in the plan view, the at least one capacitor is between the first and second collector terminals.

5. The power amplifier apparatus according to claim 1, wherein:
the at least one collector terminal comprises at least two collector terminals, a first of the at least two collector terminals is closer to a center transistor of the plurality of first transistors than to a first end transistor of the plurality of first transistors, and a second of the at least two collector terminals is closer to the center transistor of the plurality of first transistors than to a second end transistor of the plurality of first transistors, the second end transistor being at an opposite end of the plurality of first transistors than the first end transistor in the first direction.

6. The power amplifier apparatus according to claim 5, wherein:

the at least one emitter terminal comprises at least two emitter terminals, a first of the at least two emitter terminals is closer to a center transistor of the plurality of second transistors than to a first end transistor of the plurality of second transistors, and a second of the at least two emitter terminals is closer to the center transistor of the plurality of second transistors than to a second end transistor of the plurality of second transistors, the second end transistor of the plurality of second transistors being at an opposite end in the first direction of the plurality of second transistors than the first end transistor of the plurality of second transistors.

7. The power amplifier apparatus according to claim 5, wherein:

the at least one capacitor comprises a plurality of capacitors, and as seen in a plan view of the semiconductor substrate, the at least two collector terminals are between the plurality of capacitors.

8. The power amplifier apparatus according to claim 1, wherein:

the at least one collector terminal comprises a single collector terminal, and as seen in a plan view of the semiconductor substrate, the single collector terminal is closer to a center transistor of the plurality of first transistors than to an end transistor of the plurality of first transistors.

9. The power amplifier apparatus according to claim 8, wherein:

the at least one emitter terminal comprises a single emitter terminal, and as seen in the plan view, the single emitter terminal is closer to a center transistor of the plurality of second transistors than to an end transistor of the plurality of second transistors.

10. The power amplifier apparatus according to claim 8, wherein:

the at least one capacitor comprises a plurality of capacitors, and as seen in the plan view, the single collector terminal is between the plurality of capacitors.

11. The power amplifier apparatus according to claim 1, wherein as seen in a plan view of the semiconductor substrate, the at least one emitter terminal extends in the first direction and overlaps at least a portion of the plurality of second transistors.

12. The power amplifier apparatus according to claim 11, further comprising:

a base terminal electrically connected to bases of the plurality of second transistors, wherein as seen in the plan view, an area of each of the at least one collector terminals is greater than an area of the base terminal.

13. The power amplifier apparatus according to claim 1, wherein the plurality of first transistors and the plurality of second transistors are heterojunction bipolar transistors.

14. The power amplifier apparatus according to claim 2, wherein:

the at least one emitter terminal comprises at least two emitter terminals, and as seen in a plan view of the semiconductor substrate, a first of the at least two emitter terminals is at a first end of the plurality of second transistors, and a second of the at least two emitter terminals is at a second end of the plurality of second transistors, the second end being an opposite end to the first end in the first direction.

15. The power amplifier apparatus according to claim 3, wherein as seen in the plan view, the at least one capacitor is between the first and second collector terminals.

16. The power amplifier apparatus according to claim 4, wherein as seen in the plan view, the at least one capacitor is between the first and second collector terminals.

17. The power amplifier apparatus according to claim 6, wherein:

the at least one capacitor comprises a plurality of capacitors, and as seen in a plan view of the semiconductor substrate, the at least two collector terminals are between the plurality of capacitors.

18. The power amplifier apparatus according to claim 9, wherein:

the at least one capacitor comprises a plurality of capacitors, and as seen in the plan view, the single collector terminal is between the plurality of capacitors.

19. The power amplifier apparatus according to claim 2, wherein the plurality of first transistors and the plurality of second transistors are heterojunction bipolar transistors.

* * * * *